(12) United States Patent
Jou

(10) Patent No.: US 10,290,740 B2
(45) Date of Patent: May 14, 2019

(54) SEMICONDUCTOR DEVICE WITH REDUCED PARASITIC CAPACITANCE

(71) Applicant: Taiwan Semiconductor Manufacturing Company Limited, Hsinchu (TW)

(72) Inventor: Chewn-Pu Jou, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 71 days.

(21) Appl. No.: 15/475,623

(22) Filed: Mar. 31, 2017

(65) Prior Publication Data

US 2018/0286984 A1    Oct. 4, 2018

(51) Int. Cl.
*H01L 29/06*    (2006.01)
*H01L 29/10*    (2006.01)
*H01L 29/66*    (2006.01)
*H01L 29/78*    (2006.01)
*H01L 21/326*   (2006.01)
*H01L 27/088*   (2006.01)

(52) U.S. Cl.
CPC ........ *H01L 29/7851* (2013.01); *H01L 21/326* (2013.01); *H01L 27/0886* (2013.01); *H01L 29/0692* (2013.01); *H01L 29/1083* (2013.01); *H01L 29/1087* (2013.01); *H01L 29/66795* (2013.01)

(58) Field of Classification Search
CPC ............. H01L 29/1095; H01L 27/0886; H01L 21/326; H01L 29/1087; H01L 2924/0002; H01L 27/08
See application file for complete search history.

(56) References Cited

U.S. PATENT DOCUMENTS

| | | | |
|---|---|---|---|
| 2010/0164069 A1* | 7/2010 | Jou | H01L 23/5227 257/547 |
| 2016/0181358 A1* | 6/2016 | Zhang | H01L 29/66689 257/339 |
| 2018/0108755 A1* | 4/2018 | Liu | H01L 29/66681 |

* cited by examiner

*Primary Examiner* — Changhyun Yi
(74) *Attorney, Agent, or Firm* — Jones Day

(57) ABSTRACT

A semiconductor device comprising a substrate and a transistor comprising a source, drain, and gate formed on the substrate. The semiconductor device further comprises a deep well formed in the substrate at a predetermined distance below the surface of the substrate and a contact configured to electrically couple the deep well to a voltage source such that a voltage can be applied to the deep well to create a substrate depletion region for reducing parasitic capacitance between the transistor and the substrate.

20 Claims, 8 Drawing Sheets

SEMICONDUCTOR DEVICE WITH REDUCED PARASITIC CAPACITANCE

TECHNICAL FIELD

This relates to semiconductor devices and more particularly to semiconductor devices such as FinFET devices with a substrate depletion region configured to reduce parasitic capacitance.

BACKGROUND

Semiconductor devices suffer from parasitic capacitance which can degrade the high frequency performance of the device. One example of a semiconductor device is a "fin" field effect transistor (FinFET) device. FinFET devices sometimes take the form of non-planar, multi-gate transistors that include a gate, source, and drain formed on a substrate. Typically, a FinFET includes a "fin" formed on the substrate. A gate intersects the fin to divide it into two portions. The resulting fins are doped to form the source and drain regions of the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
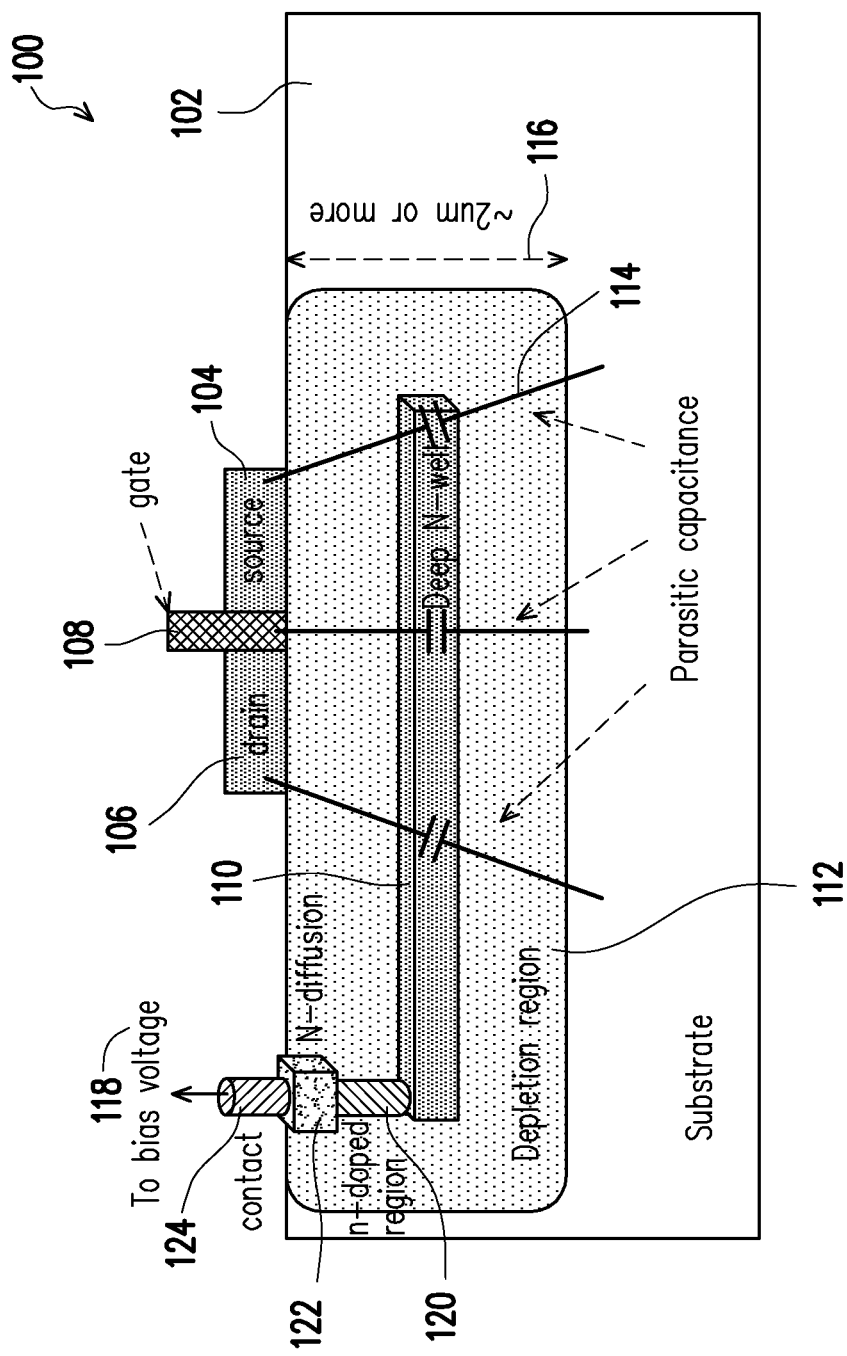
FIG. 1 is a schematic diagram of an example of a FinFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The substrate depletion regions described herein may be implemented in various types of semiconductor devices to reduce parasitic capacitance. A substrate depletion region is an insulating region within the substrate of a semiconductor device. The substrate depletion region may be formed in any of several ways including, e.g., by creating an electric field that causes free carriers within the substrate to be removed.

Parasitic capacitance generally refers to an unwanted capacitance that can exist between various portions of an electronic device or circuit. The capacitance may be caused by the proximity of the portions of the device. In the case of a FinFET device, a parasitic capacitance may exist between the FinFET device and the substrate it is formed on. The parasitic capacitance may be between any combination of one or more of the source, gate, or drain and the substrate that the source, gate, or drain are formed on. In some examples, the parasitic capacitance may be caused because of a very thin separation between the source, gate, or drain and the substrate. In some embodiments, the separation may be less than 0.2 µm. Small separations can result in the formation of a reverse biased p-n junction capacitance. This parasitic capacitance can degrade the high frequency performance of the device which results in reduced performance at higher speeds. In some embodiments, the parasitic capacitance can limit the maximum operation speed of a FinFET device.

The present disclosure provides a substrate depletion region that reduces the parasitic capacitance in a FinFET device. In some embodiments, the FinFet device may have a substrate depletion region in the substrate of the FinFET device which effectively increases the distance between the FinFET device and the substrate to reduce the junction capacitance that would otherwise be formed between the device and the substrate. In some embodiments, the substrate depletion region may be formed by applying a bias voltage to a deep N well located in the substrate to form a substrate depletion region with a sufficient thickness. A deep N-well generally refers to a structure created by N doping a portion of a P-type substrate in a layer of the substrate further below the surface (i.e., deeper) than where a typical N well would be located.

FIG. 1 is a schematic diagram of an example of a FinFET device, in accordance with some embodiments. In FIG. 1, the FinFET device 100 includes a substrate 102 and a FET device comprising a "fin" (source 104, drain 106 and gate 108) formed on the substrate 102. In some embodiments, the substrate may be a p-type substrate (e.g., a lightly doped p-type substrate) as illustrated in FIG. 1.

Figure 6A:
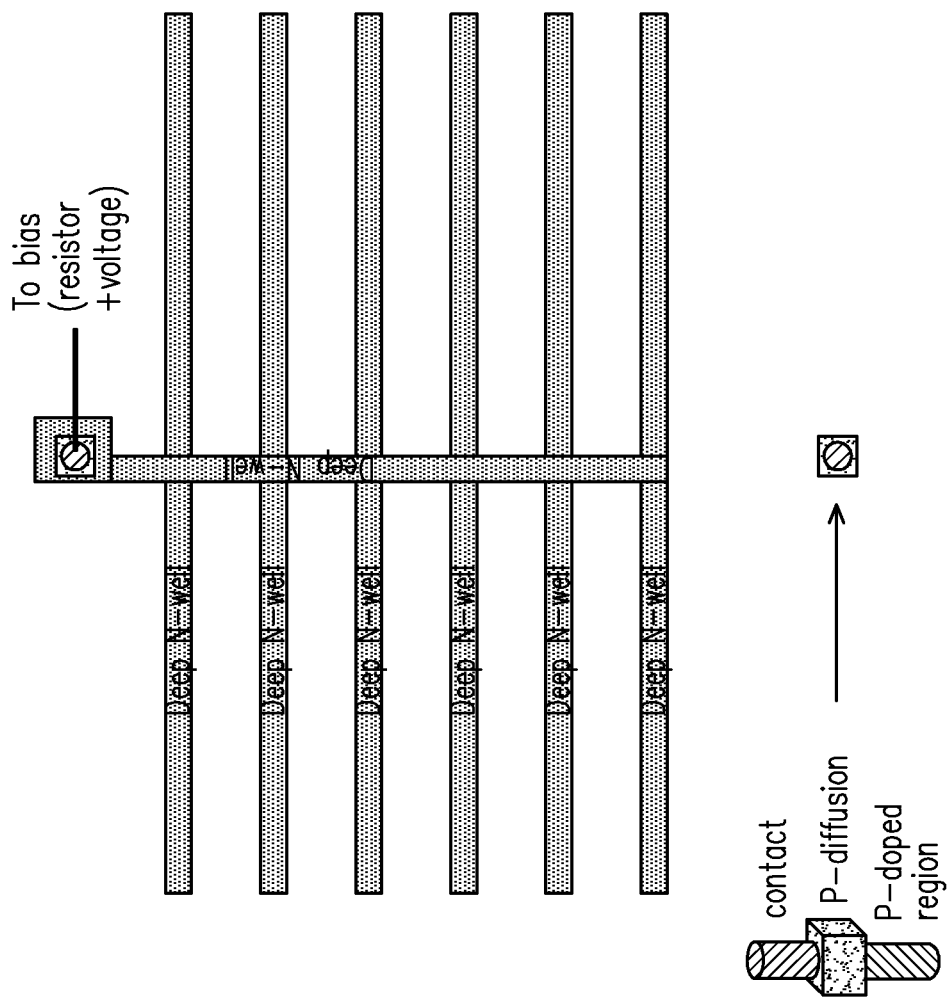
FIGS. 6A-6C illustrate various embodiments of fish bone shaped deep-N-wells, in accordance with some embodiments.
Figure 6B:
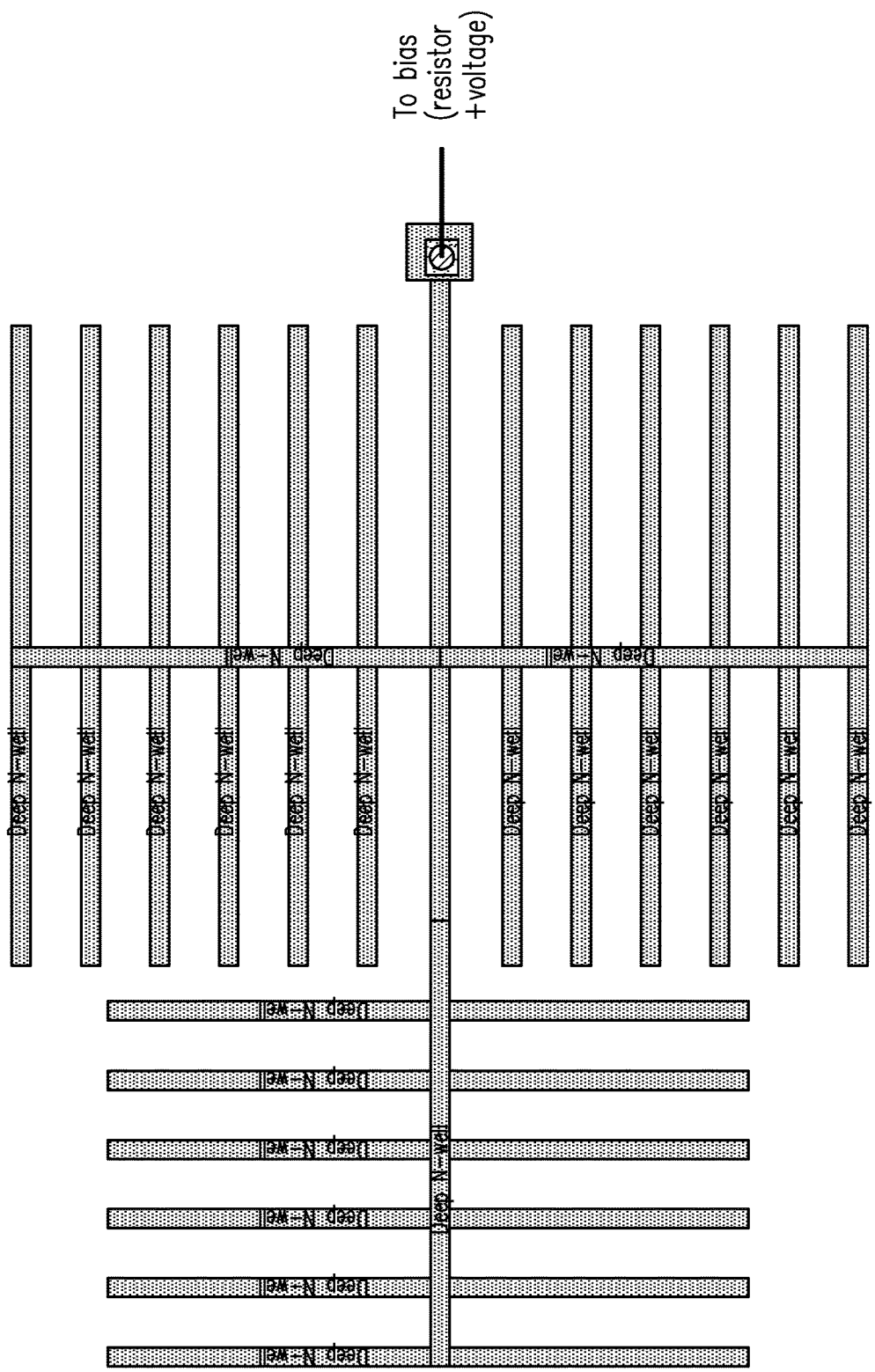
Figure 6C:
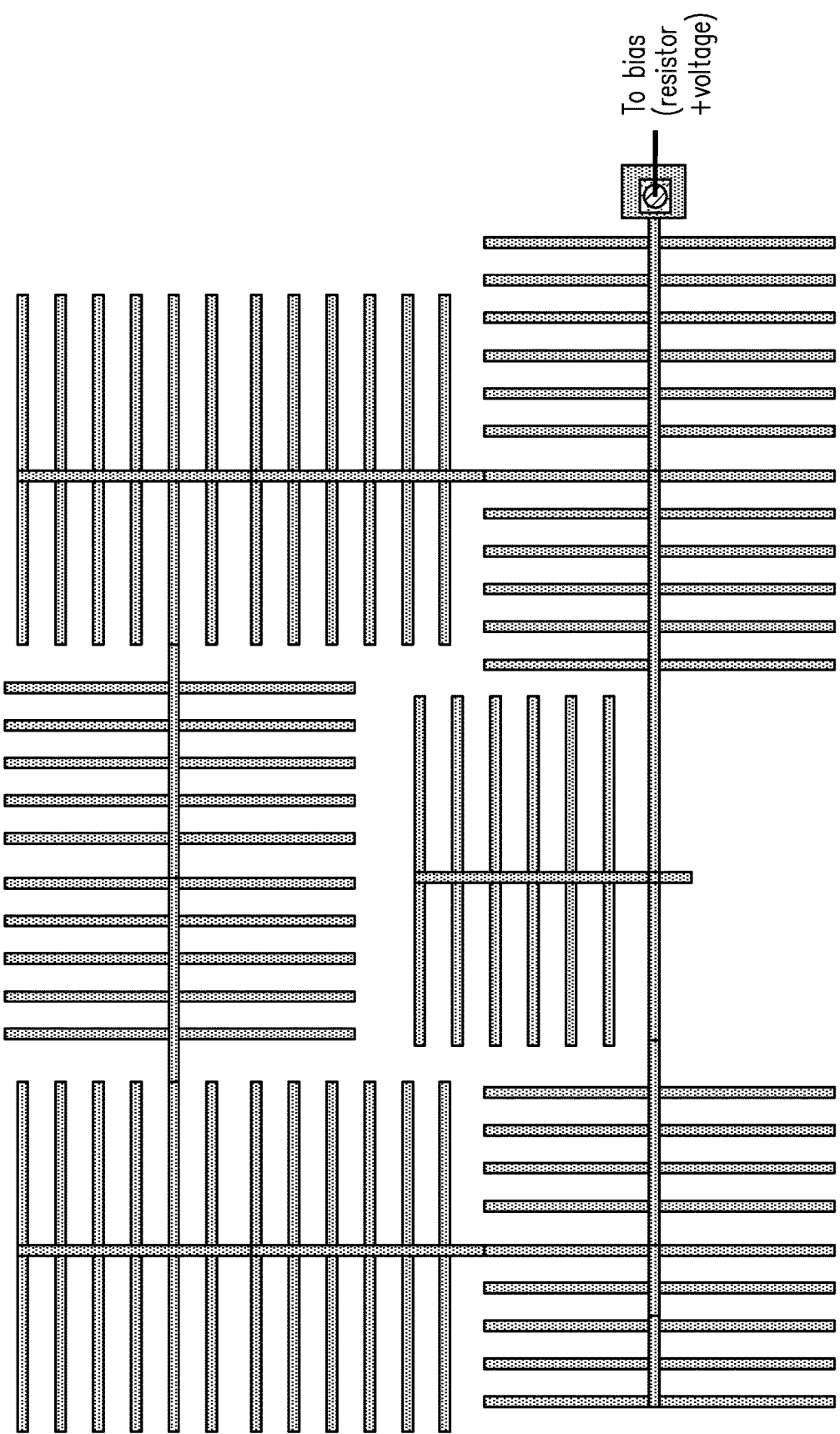

The FinFET device 100 further comprises a deep N-well 110 positioned below the FET device in the substrate 102. The deep N-well 110 may be formed by, for example, a high energy arsenic doping process (or a phosphorus, antimony, bismuth, and/or lithium doping process). The concentration of the deep N-well may be between 1E16 to 5E18 atm/cm$^3$ of dopant (e.g., arsenic). In some embodiments, the deep-N-well 110 may be highly resistive. To achieve this high resistance, the shape of the deep N-well 110 may be long and thin as shown in FIG. 1 or some other shape that creates a high resistance (rather than a high capacitance). In some embodiments, the deep N-well may have a width and/or height of between 0.1 and 10 um. In some embodiments, the length of the deep N-well may be between 0.1 and 100 um. Another example of a highly resistive shape is a fish bone shape. FIGS. 6A-6C (discussed in more detail below) illustrate various embodiments of fish bone shape deep-N-well embodiments.

The FinFET device 100 further comprises an N-doped region 120, an N-diffusion region 122, and a contact 124 to electrically couple the deep N-well 110 to a bias voltage 118. In operation, a bias voltage (e.g., 0.8-1.2, 1.0, or 1.8-3.3 Volts) 118 may be applied to the contact 124 and the application of the bias voltage 118 may create the substrate depletion region 112 around the deep N-well 110. In particular, the application of the bias voltage 118 to the deep N-well 110 creates an electric field around the deep N-well which forms the substrate depletion region 112 around the deep N-well 110.

In some embodiments, other structures may also be used to couple the contact 124 to the deep N-well 110. In some embodiments, the substrate 102 may also be highly resistive (e.g., very lightly doped p-type) which may further enhance the effects of the depletion region 112.

In some embodiments, it may be desirable for the substrate depletion region 112 to extend to the surface of the substrate 102 under the source 104, drain 106, and gate 108 of the FET device. In this manner, the reverse biased p-n capacitance between the FET and the substrate 102 is decreased because the distance to the substrate 102 is increased. In some embodiments, the size of the substrate depletion region 112 is at least partially dependent on the bias voltage 118 applied to the deep N-well 110. Accordingly, in some embodiments, the deep N-well 110 may be positioned at a predetermined depth below the surface of the substrate based on the intended bias voltage 118. In some embodiments, the deep N-well may be located between 0.1 and 10 um below the surface of the substrate.

In general, the larger the bias voltage 118, the larger the electrical distance 116 between the FET device and the substrate 102. In some embodiments, a bias voltage of about 1 Volt may result in a depletion depth of about 1 um on a single side so a total depth of about 2 um, as illustrated in FIG. 1. The increased distance reduces the parasitic capacitance 114.

In some embodiments, the deep N-well 110 and substrate depletion region 112 may increase the electrical distance from 0.2 µm to about 2 µm (i.e., a 10× increase in the electrical distance). The parasitic capacitance is inversely proportional to the electrical distance (parasitic capacitance=(area (A) of source and drain)/(distance (d) between source and drain and the substrate). Accordingly, in some embodiments, the increase in distance by 10× may result in a 10× decrease in the parasitic capacitance 114 between the source 104, drain 106 or gate 108 and the substrate 102.

Figure 2:
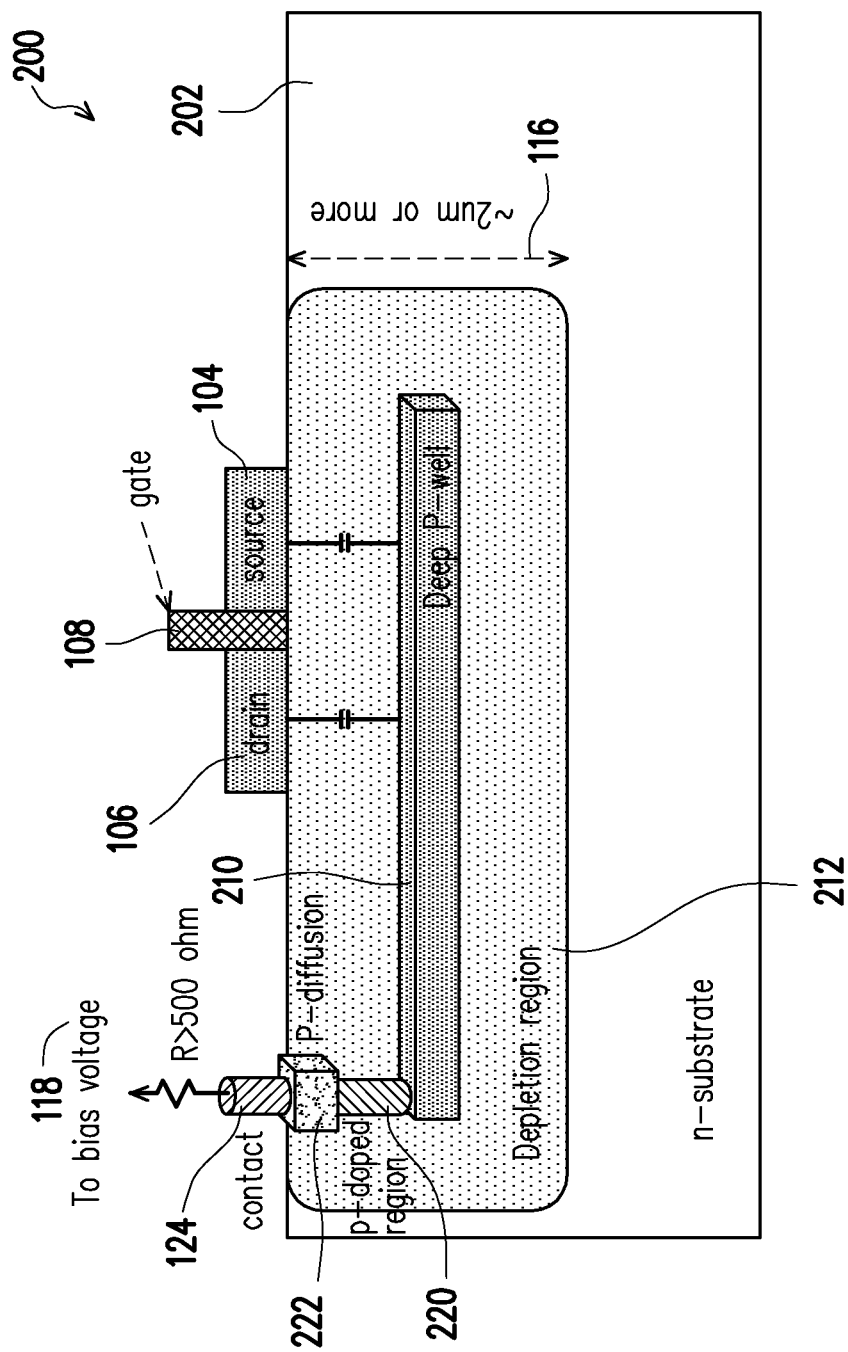
FIG. 2 is a schematic diagram of another example of a FinFET device, in accordance with some embodiments.

FIG. 2 is a schematic diagram of another example of a FinFET device, in accordance with some embodiments. In FIG. 2, the FinFET device 200 includes a substrate 202 and a FET device comprising a "fin" (source 104, drain 106 and gate 108) formed on the substrate 202. The embodiment illustrated in FIG. 2 is similar to the embodiment discussed above with respect to FIG. 1, except the substrate is an n-type substrate (e.g., a lightly doped n-type substrate).

The FinFET device 200 further comprises a deep P-well 210 positioned below the FET device in the substrate 202. The deep P-well 210 may be formed by, for example, a high energy boron doping process (or an aluminum, nitrogen, gallium, and/or indium doping process). In some embodiments, the deep-P-well 210 may be highly resistive. Similar to the embodiment described in FIG. 1, to achieve this high resistance, the shape of the deep P-well 210 may be long and thin as shown in FIG. 2 or some other shape that creates a high resistance (rather than a high capacitance). Another example of a highly resistive shape is a fish bone shape.

The FinFET device 200 further comprises an P-doped region 220, an P-diffusion region 222, and a contact 124 to electrically couple the deep P-well 210 to a bias voltage 118. As discussed in more detail with reference to FIG. 3, a resister (R) may also be provided. In operation, a bias voltage (e.g., 0.8-1.2, 1.0, or 1.8-3.3 Volts) 118 may be applied to the contact 124 and the application of the bias voltage 118 may create the substrate depletion region 212 around the deep P-well 210. In some embodiments, other structures may also be used to couple the contact 124 to the deep P-well 210.

In some embodiments, the substrate 202 may also be highly resistive (e.g., very lightly doped p-type) which may further enhance the effects of the depletion region 212.

In some embodiments, it may be desirable for the substrate depletion region 212 to extend to the surface of the substrate 202 under the source 104, drain 106, and gate 108 of the FET device. In this manner, the reverse biased p-n capacitance between the FET and the substrate 202 is decreased because the distance to the substrate 202 is increased. In some embodiments, the size of the substrate depletion region 212 is at least partially dependent on the bias voltage 118 applied to the deep P-well 210. Accordingly, in some embodiments, the deep P-well 210 may be positioned at a predetermined depth below the surface of the substrate based on the intended bias voltage 118. In general, the larger the bias voltage 118, the larger the electrical distance 116 between the FET device and the substrate 202. The increased distance reduces the parasitic capacitance discussed above with reference to FIG. 1.

In some embodiments, the deep N-well 210 and substrate depletion region 212 may increase the electrical distance from 0.2 µm to about 2 µm (i.e., a 10× increase in the electrical distance). In some embodiments, the increase in distance may result in a 10× decrease in the parasitic capacitance between the source 104, drain 106 or gate 108 and the substrate 102.

Figure 3:
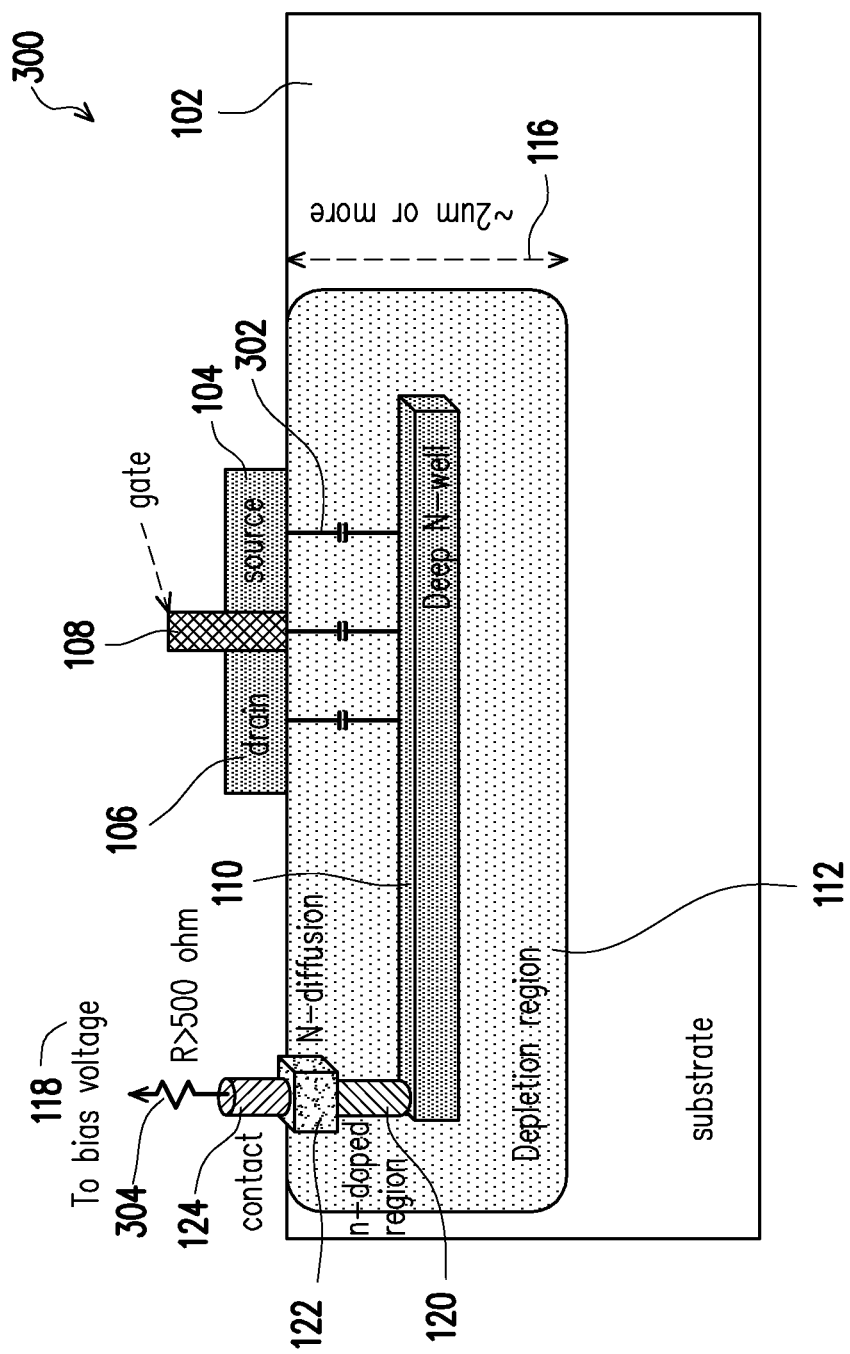
FIG. 3 is a schematic diagram of another example of a FinFET device, in accordance with some embodiments.

FIG. 3 is a schematic diagram of another example of a FinFET device, in accordance with some embodiments. In FIG. 3, the FinFET device 300 is similar to the FinFET device 100 described in FIG. 1. However, the FinFET device 300 includes a resistive network 304 to reduce the effects of capacitive coupling 302 between the source 104, drain 106, or gate 108 and the added deep N-well 110.

In FIG. 3, the FinFET device 300 includes a substrate 102 and a FET device comprising a "fin" (source 104, drain 106 and gate 108) formed on the substrate 102. In some embodiments, the substrate 102 may be a p-type substrate (e.g., a lightly doped p-type substrate). Similar to the embodiment described in FIG. 1, the FinFET device 300 comprises a deep N-well 110 positioned below the FET device in the substrate 102. The deep N-well 110 may be formed by, for example, a high energy arsenic doping process (or other doping process as discussed above). In some embodiments, the deep N-well 110 may be highly resistive. To achieve this high resistance, the shape of the deep N-well 110 may be long and thin as shown in FIG. 3 or some other shape that creates a high resistance (rather than a high capacitance).

The FinFET device 300 further comprises an N-doped region 120, an N-diffusion region 122, a contact 124 to electrically couple the deep N-well 110 to a bias voltage 118 and a resistive network 304 between the contact 124 and the bias voltage 118. In operation, a bias voltage (e.g., 0.8-1.2, 1.0, or 1.8-3.3 Volts) 118 may be applied to the resistive network 304 and the application of the bias voltage 118 may create the substrate depletion region 112 around the deep N-well 110.

As discussed above, in some embodiments, it may be desirable for the substrate depletion region 112 to extend to the surface of the substrate 102 under the source 104, drain 106, and gate 108 of the FET device. In this manner, the reverse biased p-n capacitance between the FET device and the substrate 102 is decreased because the distance to the substrate 102 is increased. In some embodiments, the size of the substrate depletion region 112 is at least partially dependent on the bias voltage 118 applied to the deep N-well 110. Accordingly, in some embodiments, the deep N-well 110 may be positioned at a predetermined depth below the surface of the substrate 102 based on the intended bias voltage 118. In general, the larger the bias voltage 118, the larger the electrical distance 116 between the FET device and the substrate 110. The increased distance reduces the parasitic capacitance 114 illustrated with reference to FIG. 1.

However, in some embodiments, the addition of the deep N-well may add capacitive coupling 302 between the source 104, drain 106, or gate 108 and the deep N-well 110. To reduce the effects of this newly introduced capacitive coupling 302 a resistive network 304 between the contact 124 and the bias voltage 118. In some embodiments, the resistive network 304 may have a resistance that is greater than 500 ohms.

Figure 4:
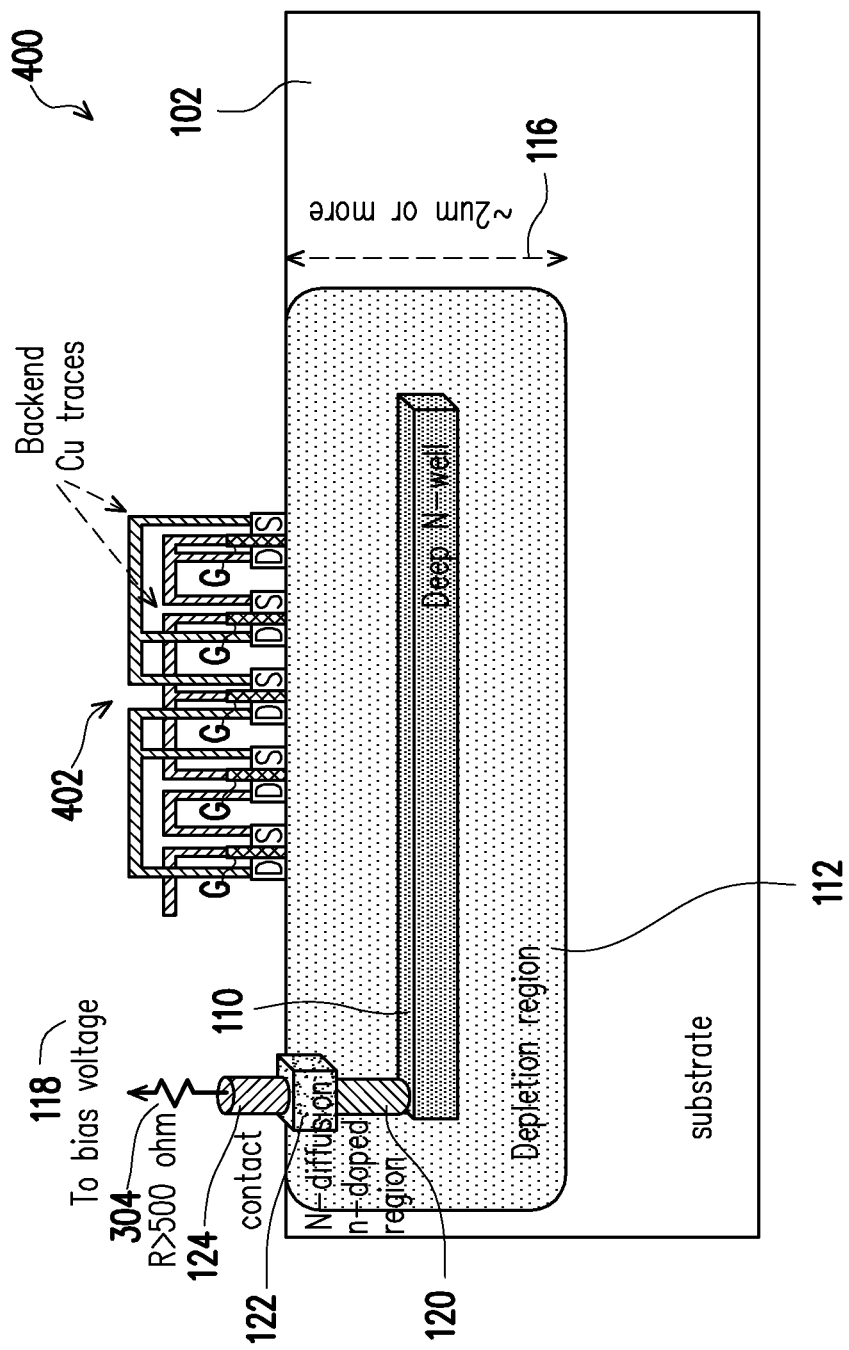
FIG. 4 is a schematic diagram of another example of a FinFET device, in accordance with some embodiments.

FIG. 4 is a schematic diagram of another example of a FinFET device, in accordance with some embodiments. As illustrated in FIG. 4, the FinFET device 400 is similar to the FinFET devices described above. However, the FinFET device 400 includes several transistor ("fins") located above a single deep N-well 110. In some embodiments, the relative scale of the deep-N-well 110 (or deep P-well 210) to the "fins" may be such that several "fins" are located above a single deep N-well (or deep P-well).

Figure 5:
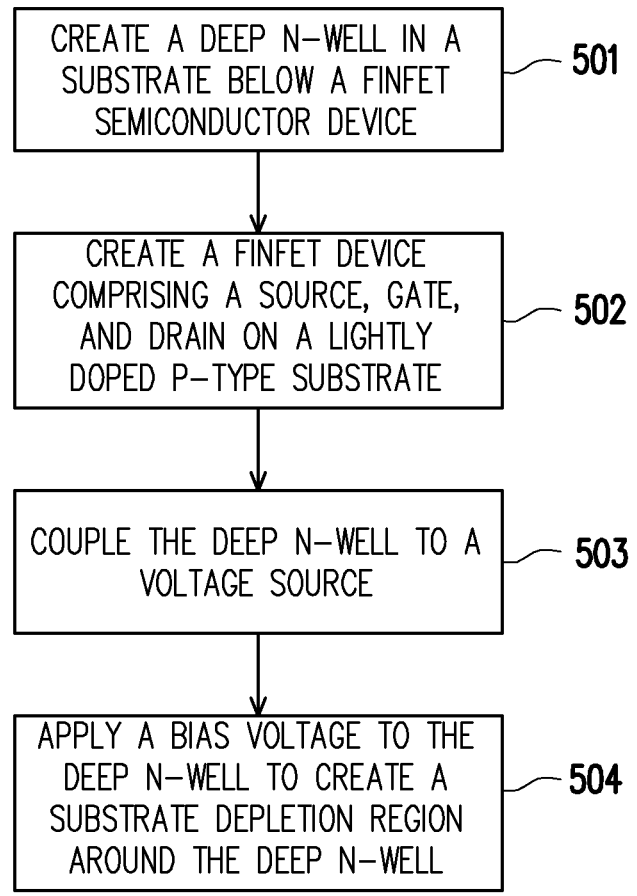
FIG. 5 is a flow chart illustrating the fabrication and operation of an example of a FinFET device, in accordance with some embodiments.

FIG. 5 is a flow chart illustrating the fabrication and operation of an example of a FinFET device, in accordance with some embodiments. In operation 501, a deep N-well 110 (or deep P-well 210) is created at a position below the intended location of a FinFET semiconductor device within the substrate 102, 202. In some embodiments, the deep N-well 110 (or deep P-well 210) may be formed by, for example, a high energy boron doping process (or other doping process as discussed above). In some embodiments, the deep N-well 110 (or the deep P-well 210) may be highly resistive. In some embodiments, the shape of the deep N-well 110 (or the deep P-well 210) may be long and thin as shown in FIGS. 1-4 or some other shape that creates a high resistance (rather than a high capacitance) such as the embodiments illustrated in FIG. 6A, 6B, and 6C. In operation 502, a FinFET device 100, 200, 300 comprising a "fin" (source 104, drain 106 and gate 108) is formed on a substrate 102, 202 that is p-type substrate (e.g., a lightly doped p-type substrate) or, alternatively, an n-type substrate (e.g., a lightly doped n-type substrate).

In operation 503, the deep N-well 110 (or the deep P-well 210) may be coupled to a voltage source 118. In some embodiments, the coupling of the deep N-well 110 and the voltage source 118 may be achieved using an N-doped region 120, an N-diffusion region 122, and a contact 124 to electrically couple the deep N-well 110 to a bias voltage 118. In operation 504, a bias voltage (e.g., 0.8-1.2, 1.0, or 1.8-3.3 Volts) 118 may be applied to the deep N-well 110 (or the deep P-well 210) to create a substrate depletion region 112, 212 around the deep N-well 110 (or the deep P-well 210).

As discussed above, the substrate depletion region 112, 212 may extend to the surface of the substrate 102 under the source 104, drain 106, and gate 108 of the FinFET device 100, 200, 300. In this manner, the reverse biased p-n capacitance between the FinFET semiconductor device and the substrate 102, 202 is decreased because the distance to the substrate 102, 202 is increased. In some embodiments, the size of the depletion region is at least partially dependent on the bias voltage 118 applied to the deep N-well 110 (or the deep P-well 210). Accordingly, in some embodiments, the deep N-well 110 (or the deep P-well 210) may be positioned at a predetermined depth below the surface of the substrate based on the intended bias voltage 118. In general, the larger the bias voltage 118, the larger the electrical distance 116 between the FET device and the substrate 102, 202. The increased distance reduces the parasitic capacitance 114.

In some embodiments, the deep N-well 110 (or the deep P-well 210) and substrate depletion region 112, 212 may increase electrical distance from 0.2 μm to about 2 μm (i.e., a 10× increase in the electrical distance). In some embodiments, the increase in distance may result in a 10× decrease in the parasitic capacitance between the source 104, drain 106 or gate 108 and the substrate 102, 202.

FIGS. 6A-6C illustrates various embodiments of fish bone shaped deep-N-wells, in accordance with some embodiments. As illustrated in FIG. 6A, the deep N-well may include a substantially linear structure and several additional linear structures that are parallel to one another and substantially perpendicular to the first structure. In this manner, the overall structure of the deep N-well resembles a fish bone. Generally speaking, any structure is permissible as long as the structure does not form a loop. In some embodiments, the spacing between the adjacent linear structures may be 0.1 to 10 um (e.g., less than about 2 um). FIGS. 6B and 6C illustrate further embodiments comprising nested fishbone structures.

Some embodiments described herein may include a semiconductor device comprising a substrate and a transistor comprising a source, drain, and gate formed on the substrate. The semiconductor device further comprises a deep N-well formed in the substrate at a predetermined distance below the surface of the substrate and a contact configured to electrically couple the deep N-well to a voltage source such that a voltage can be applied to the deep N-well to create a substrate depletion region for reducing parasitic capacitance between the transistor and the substrate.

Some embodiments described herein may include a structure for reducing parasitic capacitance comprising a substrate and a deep N-well formed in the substrate at a predetermined distance below the surface of the substrate. A contact is provided and configured to electrically couple the deep N-well to a voltage source such that a voltage can be applied to the deep N-well to create a substrate depletion region for reducing parasitic capacitance between the transistor and the substrate.

Some embodiments described herein may include a method for fabricating a semiconductor device for reducing a parasitic capacitance between a substrate and a transistor formed on the surface of the substrate, comprising forming a deep well in a lightly doped p-type substrate at a predetermined depth below the surface of the substrate and forming a FinFET device above the deep well comprising a source, gate, and drain on the substrate and. The deep well includes a structure configured to allow the deep well to be coupled to a voltage source. The semiconductor device is configured such that when a bias voltage is applied to the deep well a substrate depletion region around the deep well is created to reduce parasitic capacitance between the transistor and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device comprising:
   a substrate;
   a transistor comprising a source, drain, and gate formed on a top surface of the substrate;
   a deep well formed in the substrate at a predetermined distance below the top surface of the substrate; and
   a contact configured to electrically couple the deep well to a voltage source such that a voltage can be applied to the deep well to create a substrate depletion region;
   wherein a bottom surface of the contact, a bottom surface of the source, a bottom surface of the drain, and a bottom surface of the gate are coplanar; and
   wherein the transistor and the contact are not electrically coupled.

2. The semiconductor device of claim 1, wherein the deep well is one of a deep N-well or a deep P-well.

3. The semiconductor device of claim 1, wherein the substrate depletion region is configured to reduce the parasitic capacitance between the transistor and the substrate.

4. The semiconductor device of claim 1, wherein the semiconductor device is a fin field effect transistor (FinFET).

5. The semiconductor device of claim 1, wherein the predetermined distance is selected based at least in part on the voltage applied to the deep well.

6. The semiconductor device of claim 1, wherein the substrate depletion region extends to the top surface of the substrate to increase the distance between the transistor and the substrate.

7. The semiconductor device of claim 1, wherein the substrate is one of a lightly doped p-type substrate or a lightly doped n-type substrate.

8. The semiconductor device of claim 1, wherein the substrate is highly resistive.

9. The semiconductor device of claim 1, wherein the deep well is formed below the transistor.

10. The semiconductor device of claim 1, wherein the deep well is a well formed below the top surface of the substrate.

11. The semiconductor device of claim 1, further comprising a resistive network coupled between the voltage source and the deep well.

12. A structure for reducing parasitic capacitance comprising:
    a substrate;
    a deep well formed in the substrate at a predetermined distance below an top surface of the substrate; and
    a contact configured to electrically couple the deep well to a voltage source such that a voltage can be applied to the deep well to create a substrate depletion region;
    wherein at least one transistor comprising a source, gate, and drain is formed on a top surface of the substrate above the deep well and a bottom surface of the contact, a bottom surface of the source, a bottom surface of the drain, and a bottom surface of the gate are coplanar; and
    wherein the at least one transistor and the contact are not electrically coupled.

13. The structure of claim 12, wherein the deep well is one of a deep N-well or a deep P-well.

14. The structure of claim 12, wherein the substrate depletion region is configured to reduce the parasitic capacitance between the substrate and a transistor formed on the top surface of the substrate above the deep well.

15. The structure of claim 12, wherein the predetermined distance is selected based at least in part on the voltage applied to the deep well.

16. The structure of claim 12, wherein the substrate depletion region extends to the top surface of the substrate to increase the distance between the substrate and a transistor formed on the top surface of the substrate.

17. The structure of claim 12, wherein the substrate is one of a lightly doped p-type substrate or a lightly doped n-type substrate.

18. The structure of claim 12, wherein the deep well is formed below the transistor.

19. The structure of claim 12, wherein the deep well is a well formed below the top surface of the substrate.

20. A semiconductor device comprising:
    a substrate;
    a transistor comprising a source, drain, and gate formed on a top surface the substrate;
    a deep well formed in the substrate at a predetermined distance below the top surface of the substrate; and
    a contact configured to electrically couple the deep well to a voltage source such that a predefined voltage can be applied to the deep well to create a substrate depletion region;
    wherein a bottom surface of the contact, a bottom surface of the source, a bottom surface of the drain, and a bottom surface of the gate are coplanar; and
    wherein the predetermined distance between the deep well and the top surface of the substrate is selected such that when the predefined voltage is applied to the deep well, the substrate depletion region extends substantially to the upper surface of the substrate to increase the distance between the transistor and the substrate; and
    wherein the transistor and the contact are not electrically coupled.

* * * * *